US006256572B1

(12) United States Patent
Rea

(10) Patent No.: US 6,256,572 B1
(45) Date of Patent: Jul. 3, 2001

(54) REMOTE PROGRAMMING OF AN ABS ELECTRONIC CONTROL MODULE

(75) Inventor: Paolo Rea, Dearborn, MI (US)

(73) Assignee: Kelsey-Hayes Company, Livonia, MI (US)

( * ) Notice: Subject to any disclaimer, the term of this patent is extended or adjusted under 35 U.S.C. 154(b) by 0 days.

(21) Appl. No.: 09/534,862

(22) Filed: Mar. 24, 2000

Related U.S. Application Data
(60) Provisional application No. 60/126,907, filed on Mar. 30, 1999.

(51) Int. Cl.[7] ............................. B60T 83/34; B60T 7/12
(52) U.S. Cl. ....................... 701/71; 701/70; 439/852; 439/510; 303/119.3; 303/113.1; 303/DIG. 10
(58) Field of Search ............................. 701/71, 1, 2, 70; 303/140, 146, 113.1, 119.3, DIG. 10; 439/510, 852

(56) References Cited

U.S. PATENT DOCUMENTS

| | | |
|---|---|---|
| 3,963,986 | 6/1976 | Morton et al. . |
| 5,040,168 * | 8/1991 | Maue et al. ........................ 359/115 |
| 5,323,107 | 6/1994 | D'Souza . |
| 5,432,741 | 7/1995 | Devore et al. . |
| 5,478,244 * | 12/1995 | Maue et al. ........................ 439/76.2 |
| 5,529,389 * | 6/1996 | Sekiguchi ......................... 303/116.4 |
| 5,533,469 | 7/1996 | Touchton et al. . |
| 5,618,085 * | 4/1997 | Siegel et al. ...................... 303/113.1 |
| 5,624,165 * | 4/1997 | Moon ................................ 303/119.2 |
| 5,655,927 * | 8/1997 | Maue et al. ........................ 439/510 |
| 5,957,547 * | 9/1999 | Schliebe et al. .................. 303/119.3 |
| 6,059,381 * | 5/2000 | Bayer ................................ 303/119.3 |
| 6,114,952 * | 9/2000 | Francesangeli et al. ............ 340/453 |
| 6,160,526 * | 12/2000 | Hirai et al ......................... 343/895 |

* cited by examiner

Primary Examiner—William A. Cuchlinski, Jr.
Assistant Examiner—Olga Hernandez
(74) Attorney, Agent, or Firm—MacMillan, Sobanski & Todd, LLC

(57) ABSTRACT

At least one surface contact is formed upon a circuit substrate disposed within a housing for electronic control unit for an anti-lock brake system. The surface contact is electrically connected to a programming port of a microprocessor mounted upon the circuit substrate. A probe is extended into housing and into electrical contact with the surface contact. A algorithm for controlling the operation of the anti-lock brake system is then transferred through the probe and into the microprocessor, where it is stored for use during anti-lock braking operations.

26 Claims, 9 Drawing Sheets

REMOTE PROGRAMMING OF AN ABS ELECTRONIC CONTROL MODULE

CROSS REFERENCE TO RELATED APPLICATIONS

This application claims the benefit of U.S. Provisional Application No. 60/126,907, filed Mar. 30, 1999.

BACKGROUND OF THE INVENTION

This invention relates in general to electro-hydraulic control units for anti-lock brake systems and in particular to a method and apparatus for remote programming of a microprocessor in an Anti-lock Brake System electronic control module.

An anti-lock brake system (ABS) is often included as standard equipment on new vehicles. When actuated, the ABS is operative to control the operation of some or all of the vehicle wheel brakes. A typical ABS, which controls all four vehicle wheels, includes a plurality of normally open and normally closed solenoid valves which are mounted within a control valve body and connected to the vehicle hydraulic brake system. A separate hydraulic source, such as a motor driven pump, is included in the ABS for reapplying hydraulic pressure to the controlled wheel brakes during an ABS braking cycle. The pump is typically included within the control valve body while the pump motor is mounted upon the exterior of the control valve body.

It is also known to provide an ABS for the rear wheels only. Such a system is commonly referred to as a rear wheel anti-lock brake system (RWAL). Typically, RWAL does not include a motor driver pump, but utilizes the vehicle master brake cylinder as a source of pressurized brake fluid. While RWAL has a limited volume of pressurized brake fluid available during an ABS braking cycle, elimination of the pump and pump motor simplifies the system while reducing the cost thereof.

Both four wheel ABS and two wheel RWAL include an electronic control module which has a microprocessor. The control module is electrically coupled to the pump motor, for a four wheel ABS, a plurality of solenoid coils associated with the solenoid valves, one or more wheel speed sensors for monitoring the speed and deceleration of the controlled wheels and the vehicle brake light switch. The control module is typically mounted within a removable housing which is attached to the control valve body to form a compact unit which is often referred to as an ABS Electro-Hydraulic Control Unit (EHCU).

It is known to mount the coils for actuating the solenoid coils within the control module housing. Tubular sleeves which enclose the valve armatures extend from the valve body, forming a seal for the hydraulic brake circuit. When the control module housing is mounted upon the valve body, each of sleeves is received by an associated solenoid coil. Accordingly, the housing can be removed from the valve body for servicing of the electronics without opening the hydraulic brake circuit. The structure of the housing and coil assembly is commonly referred to as a Coil Integrated Module (CIM).

During vehicle operation, the microprocessor in the ABS control module continuously receives speed signals from the wheel speed sensors. The microprocessor monitors the wheel speed signals for potential wheel lock-up conditions and the brake light switch for brake acutations. When the vehicle brakes are applied and the microprocessor senses an impending wheel lock-up condition, the microprocessor is operative to actuate the pump motor, in a four wheel ABS, and selectively operate the solenoid valves in the valve body to cyclically relieve and reapply hydraulic pressure to the controlled wheel brakes. The hydraulic pressure applied to the controlled wheel brakes is adjusted by the operation of the solenoid valves to limit wheel slippage to a safe level while continuing to produce adequate brake torque to decelerate the vehicle as desired by the driver.

The microprocessor includes a Read Only Memory (ROM) which is loaded with an ABS algorithm for controlling the operation of the microprocessor. The algorithm corresponds to a particular vehicle platform and can include trim values which are selected to match the characteristics of a specific configuration of the vehicle platform.

SUMMARY OF THE INVENTION

This invention relates to a method and apparatus for remote programming of a microprocessor in an Anti-lock Brake System electronic control module.

As described above, the microprocessor in an ABS Electronic Control Module (ECM) is programmed for the particular vehicle platform and the specific version of the platform upon which the ABS Electro-Hydraulic Control Unit (EHCU) is installed. It is known to have the microprocessor supplier preprogram the microprocessor ROM during fabrication of the microprocessor. It is also known for the EHCU supplier to program the microprocessor before installation in the ECU and assembly of the EHCU. However, these know methods require that the Microprocessor supplier or the EHCU supplier be provided with the number of units required for each vehicle platform since long lead times are required to assure that the microprocessors are properly programmed. If the vehicle build plans are changed, it may be necessary to hold a number of programmed microprocessors or EHCU's in stock until needed. Stocking of microprocessors and/or EHCU's requires storage space and also ties up capitol. Accordingly, a more efficient method of programming the microprocessors is desirable.

The present invention contemplates an electronic control unit for an anti-lock brake system which includes a housing having an aperture formed therethrough. A circuit substrate is disposed within the housing and a microprocessor is mounted upon the substrate. The microprocessor controls the anti-lock brake system. Additionally, at least one electrical contact surface is mounted upon the substrate; the surface contact being adjacent to the housing aperture and electrically connected to the microprocessor. The contact is adapted to electrically contact a tool which can transfer an algorithm for operating the anti-lock brake system through the contact to said microprocessor.

It is further contemplated that the microprocessor includes a memory and the algorithm is stored within said memory. In the preferred embodiment, the memory is a read only memory. It is also contemplated that a plurality of electrical contacts are mounted upon the substrate with each of the contacts being electrically connected to the microprocessor and being adapted to be connected to the tool for transferring the algorithm.

The tool can have a single probe portion which extends into the housing, the probe carrying a plurality of conductors with each of the conductors contacting a corresponding surface contact for transferring the algorithm. Alternately, the tool can have a plurality of probes which extend into the housing, each of said probes carrying at least one conductor with each of the conductors contacting a corresponding surface contact for transferring the algorithm.

The invention also contemplates having at least one electrical contact surface mounted upon an exterior surface of the housing. The contact extends through the housing and is electrically connected to the microprocessor.

The invention further contemplates a process for assembling a electro-hydraulic control unit for an anti-lock brake system which includes providing a microprocessor. The microprocessor is installed upon a circuit substrate and the circuit substrate is then installed in an electronic control module housing. The microprocessor is electrically connected to at least one surface mounted contact formed upon the surface of the circuit substrate. A programming tool is extended into contact with the surface contact. An algorithm is loaded into the microprocessor. The programming tool is then retracted. Finally, the electronic control module is assembled upon a control valve body to form an electro-hydraulic electronic control unit.

Various objects and advantages of this invention will become apparent to those skilled in the art from the following detailed description of the preferred embodiment, when read in light of the accompanying drawings.

DETAILED DESCRIPTION OF THE PREFERRED EMBODIMENT

Figure 1:
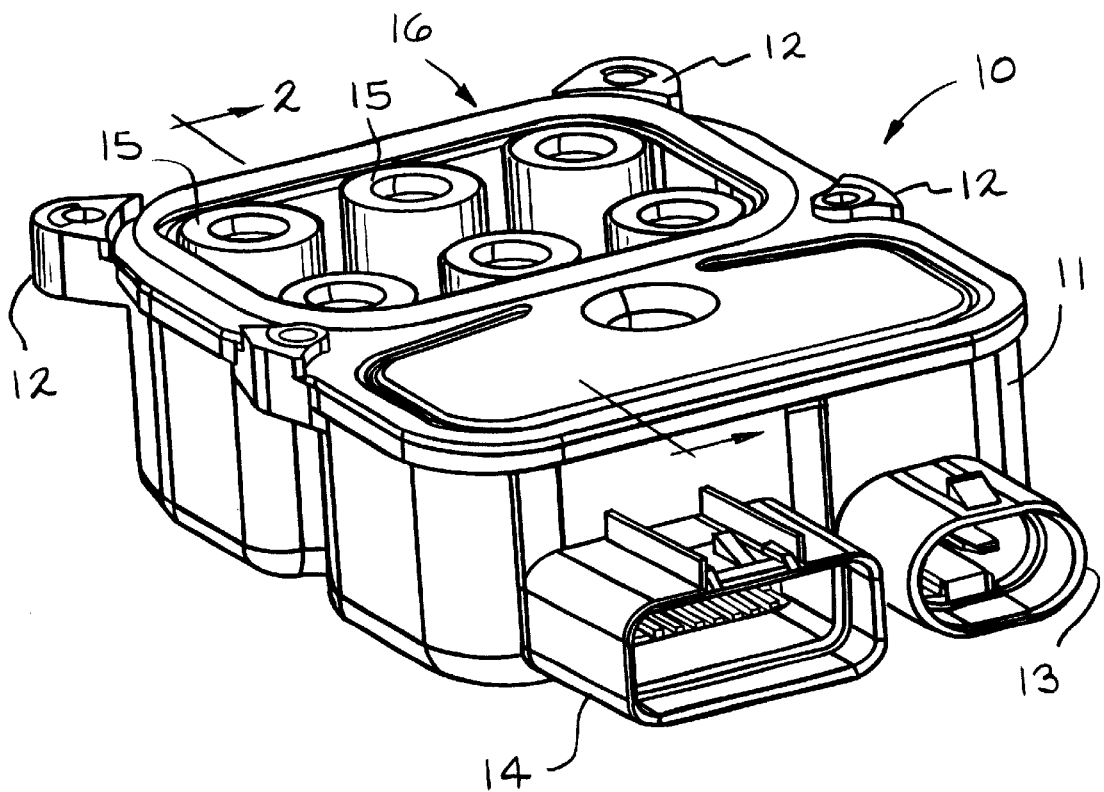
FIG. 1 is a perspective view of an Anti-lock Brake System electronic control module.

Referring now to the drawings, there is illustrated in FIG. 1 a perspective view of a typical ECM 10. The ECM 10 is inverted in FIG. 1 to shown internal components. The ECM 10 includes an external housing 11, which is typically formed from plastic. A plurality of tabs 12 extend from the housing 11. Each tab 12 has an aperture formed therethrough which receives a threaded fastener (not shown) for securing the ECM 10 to an ABS valve body (not shown). A first electrical connector 13 extends from a side of the housing 11 for coupling the ECM to the vehicle power supply (not shown). A second electrical connector 14 also extends from a side of the housing 11 for coupling electronic components within the ECM 10 to other ABS components, such as the wheel speed sensors. A plurality of solenoid coils 15 are disposed within the housing 11. An opening 16 formed through the housing 11 allows the solenoid valve sleeves to extend into the coils 15 when the ECM 10 is mounted upon the associated ABS valve body.

Figure 2:
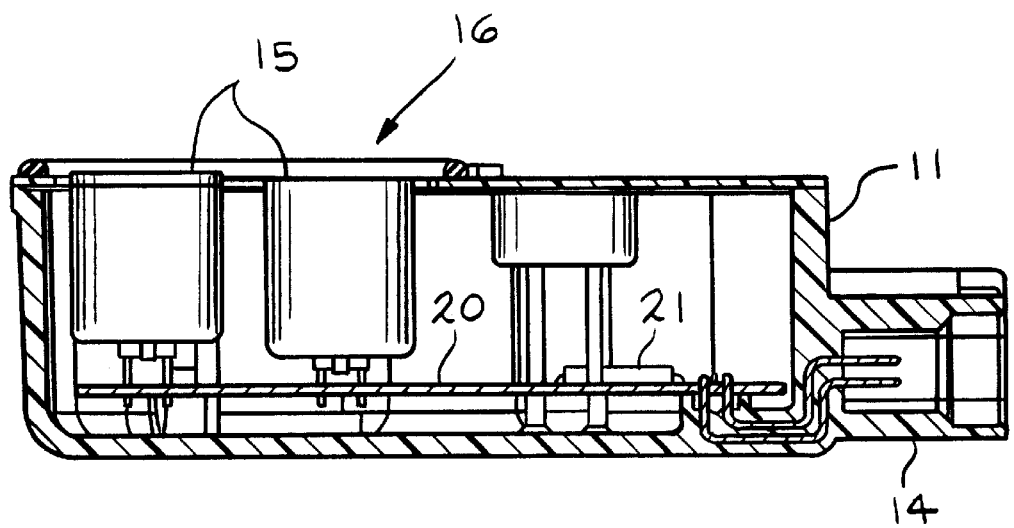
FIG. 2 a sectional view taken along line 2—2 of the control module shown in FIG. 1.

As illustrated in the sectional view of the ECM 10 shown in FIG. 2, the coils 15 are mounted upon a Printed Circuit Board (PCB) 20 which is also disposed within the housing 11. A microprocessor 21 having a flash programmable ROM and other electronic components (not shown) are mounted upon the PCB 20. The microprocessor 21 and electronic components are electrically connected to the coils 15 and connectors 13 and 14 by electrical traces which are deposited upon the surface of the PCB 20. Alternately, the PCB 20 can be formed from a plurality of laminated layers with the traces deposited between the layers.

The present invention contemplates flash programming the microprocessor 21 after the microprocessor 21 has been mounted upon the PCB 20 and the PCB 20 installed in the ECM housing 11. As best seen in the plan view of the PCB 20 shown in FIG. 3, a plurality of surface mounted contacts 25 are formed upon the surface of the PCB 20. The contacts 25 are connected by conventional electrical traces (not shown) to the microprocessor 21.

Figure 3:
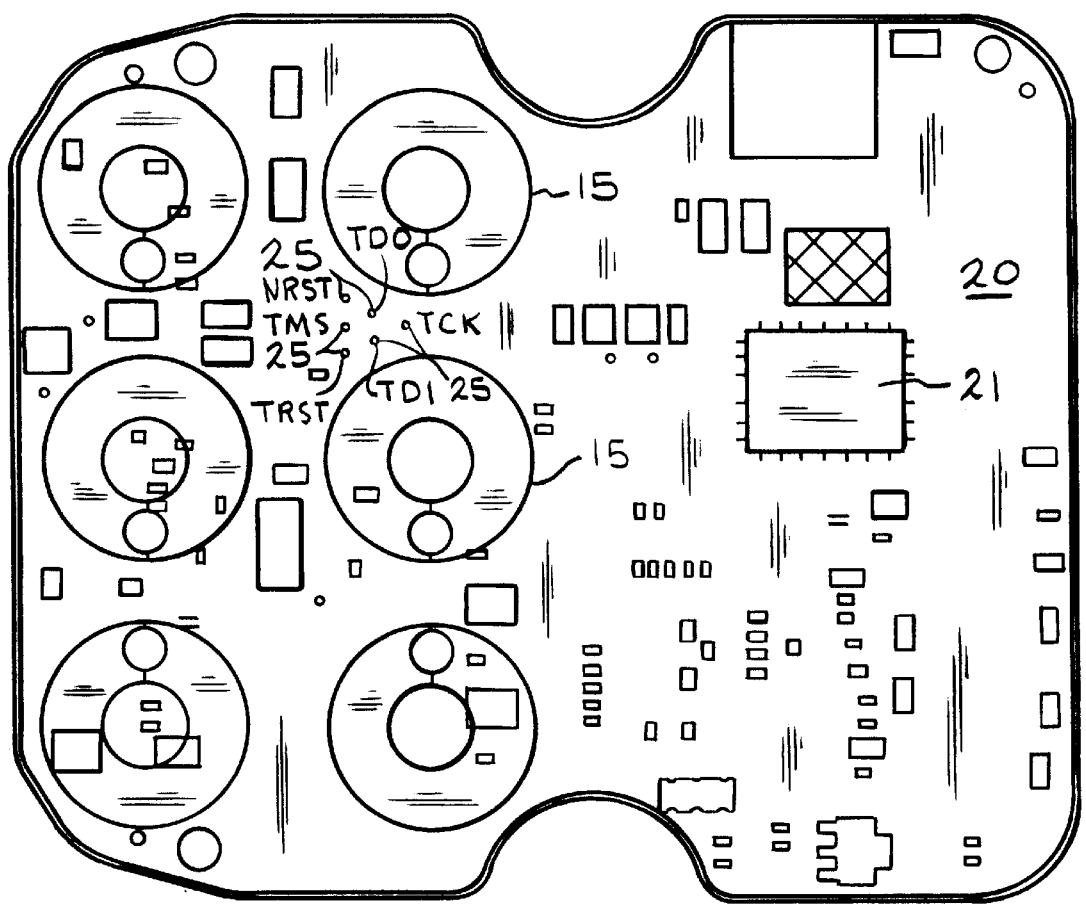
FIG. 3 is a plan view of a circuit board in accordance with the invention which is disposed within the control module shown in FIG. 1.

In the preferred embodiment, the Joint Test Action Group (JTAG) ports of the microprocessor, which are normally used to test the microprocessor, are utilized for flash programming the microprocessor. The microprocessor JTAG ports include six pins, which are connected to the six surface contacts 25 shown in FIG. 3. It will be appreciated, however, that the invention also can be practiced with more or less contacts 25. The surface mounted contacts 25 shown in FIG. 3 are labeled for the following JTAG functions:

TCK—Test Clock;
TDO—Test Data Output;
TDI—Test Data Input;
NRST—Test Negative Reset;
TMS—Test Mode Selector; and
TRST—Test Reset.

Figure 4:
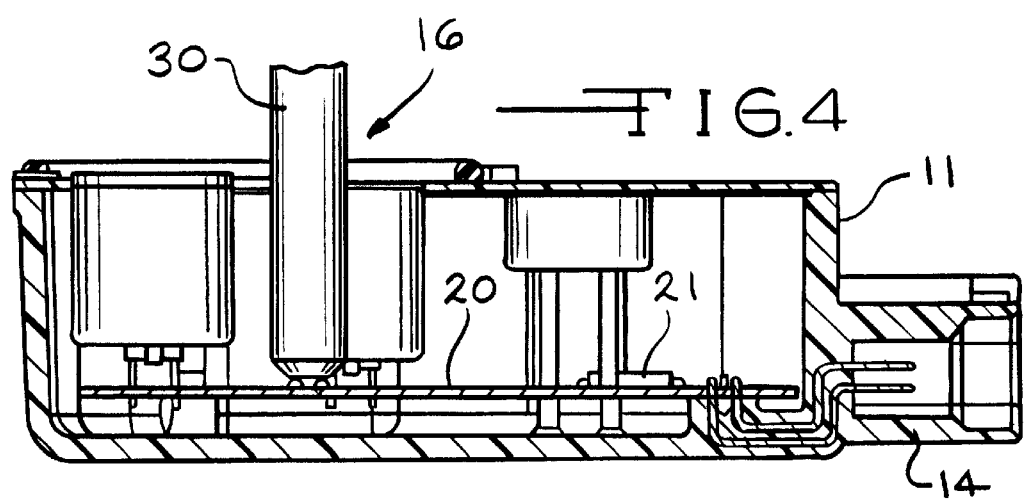
FIG. 4 is a sectional view taken along line 2—2 of the control module in FIG. 1 which illustrates remote programming of the module.

The surface mounted contacts 25 are positioned upon the PCB 20 and beneath the housing opening 16. Accordingly, the contacts 25 are accessible to a programming tool 30 which, as shown in FIG. 4, is extended through the housing opening 16 and into contact with the surface contacts 25. Components shown in FIG. 4, which are similar to components shown in the FIGS. 1 through 3, have the same numerical designators. In the preferred embodiment, the programming tool 25 has a housing which is shaped to correspond to the adjacent coils 15. Accordingly, the coils 15 would guide the tool 30 into position over the contacts 25. Alternately, guide pins (not shown) could be installed upon the PCB 20 projecting in an upward direction in FIG. 4, or the assembly line conveyor could include a precision positioning apparatus (not shown) to locate the housing 11, and thereby the PCB 20 and contacts 25 relative to the tool 30.

After the programming tool 30 contacts the surface contacts 25, the ABS control algorithm is loaded through the tool 30 into the microprocessor ROM. In the preferred embodiment, it is expected that the loading will take less than 30 seconds and perhaps as little as approximately three seconds. It also is expected that the algorithm loading process would be fully automated. The tool 30 is then retracted and the ECM 10 installed upon a control valve to form a complete EHCU (not shown).

The invention provides several advantages. For example, the EHCU's can be fabricated with unprogrammed microprocessors with a control algorithm loaded into the microprocessor ROM at a later time to match specific vehicle builds. Also, both the time to fabricate the EHCU's and EHCU inventory requirements would be reduced. Furthermore, running changes in the algorithm can be easily incorporated into the EHCU.

Figure 5:
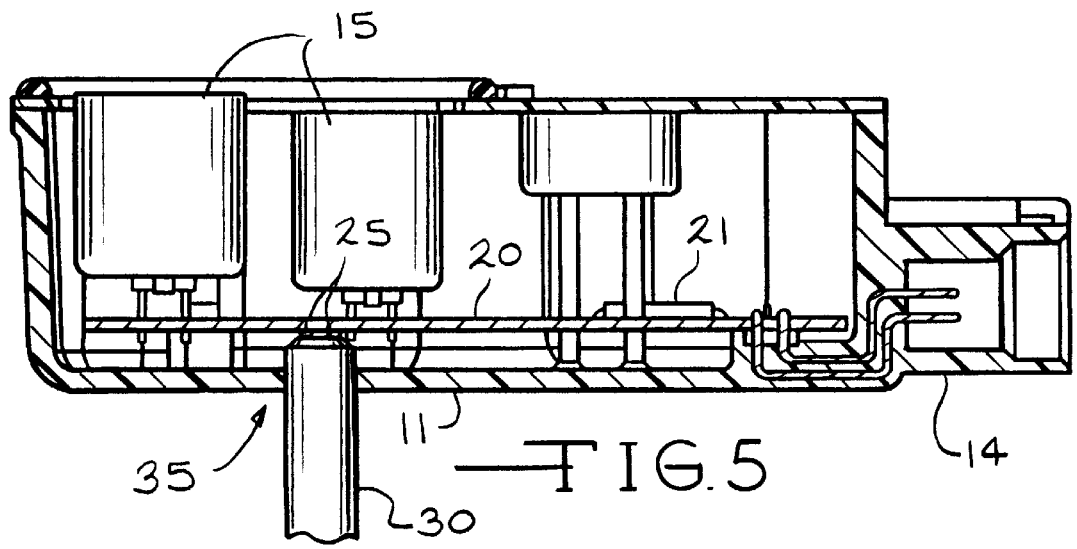
FIG. 5 is an alternate embodiment of the control module shown in FIG. 4.

As described above, the microprocessor 21 is programmed before the ECM 10 is installed upon the valve body. The invention also contemplates an alternate embodiment, which is illustrated in FIG. 5. Components shown in FIG. 5 which are similar to components shown in the preceding figures have the same numerical designators. In the alternate embodiment, the surface contacts 25 are formed upon the lower surface of the PCB 20. An aperture 35 formed through the EHCU housing 11 allows accessibility to the contacts 25 for the programming tool 30. It will be appreciated that, because the accessibility is not limited by the housing opening 16, the contacts 25 can be located in other positions on the PCB 20 than shown in FIG. 5.

After programming, a plug (not shown) is inserted into the aperture 35 to seal the housing 11.

The alternate embodiment shown in FIG. 5 allows programming of the microprocessor 21 after the EHCU is fully assembled. The programming can be carried out at the EHCU manufacturing facility or at the vehicle manufacturer's facilities. Additionally, if the service departments for the vehicle are supplied with the programming tool, the service departments also can program or reprogram the microprocessor. Thus, the service departments could reduce stockage of replacement EHCU's and could reprogram the ABS software to incorporate running software changes.

Figure 6:
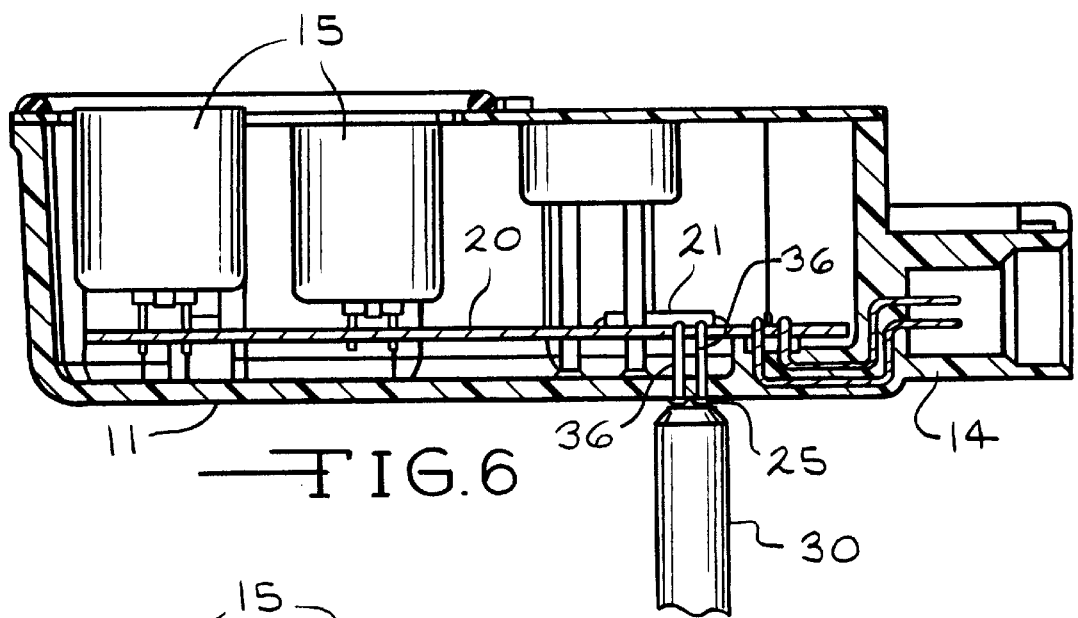
FIG. 6 is an alternate embodiment of the control module shown in FIG. 5.

An alternate embodiment of the ECU shown in FIG. 5 is illustrated in FIG. 6. In FIG. 6, the microprocessor JTAG ports are electrically connected to pins 36 which extend in a downward direction through the lower surface of the housing 14. The pins 36 terminate in surface contacts 25 which are formed upon the exterior surface of the housing 25. Accordingly, the surface contacts 25 are directly accessible to the programming tool 30. Additionally, a plug is not required to seal the programming tool access aperture.

Figure 7:
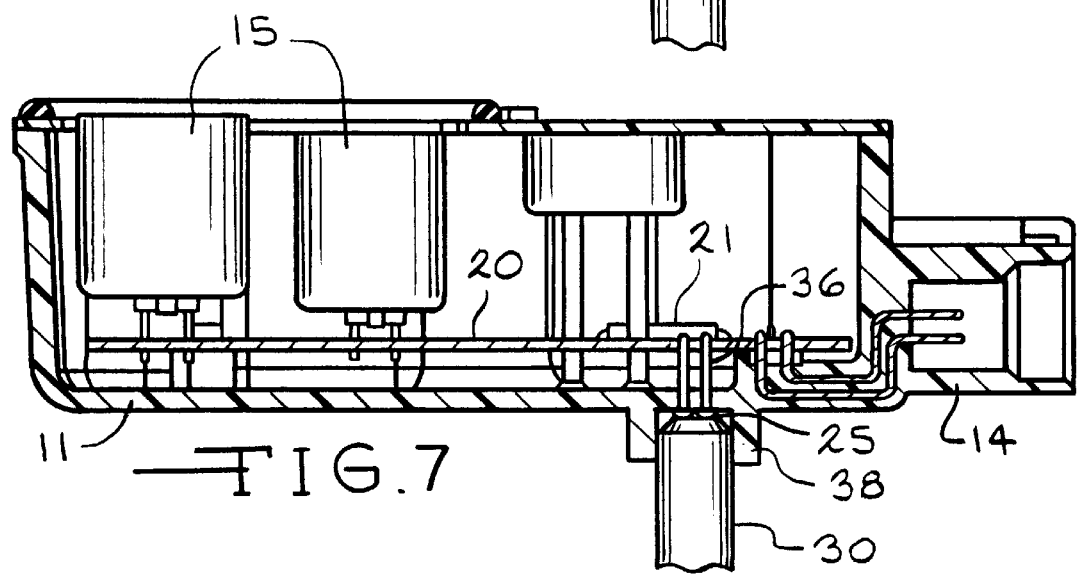
FIG. 7 is another alternate embodiment of the control module shown in FIG. 6.

FIG. 7 illustrates an alternate embodiment of the ECU shown in FIG. 6. In FIG. 7, a collar 38 is formed upon the housing 14 and extends perpendicularly therefrom. The collar 38 is formed around the surface contacts 25 and guides the programming tool 30 into contact with the surface contacts 25 for programming the microprocessor 21. It is contemplated that an axially extending key (not shown) can be formed upon the interior surface of the collar 38. A corresponding axially extending keyway (not shown) would be formed in the surface of the programming tool 30. The key would cooperate with the key way to orient the programming tool 30 relative to the surface contacts 25. Alternately, the collar 38 and programming tool could have complementary shapes (not shown) to assure alignment of the tool 30 with the surface contacts 25.

Figure 8:
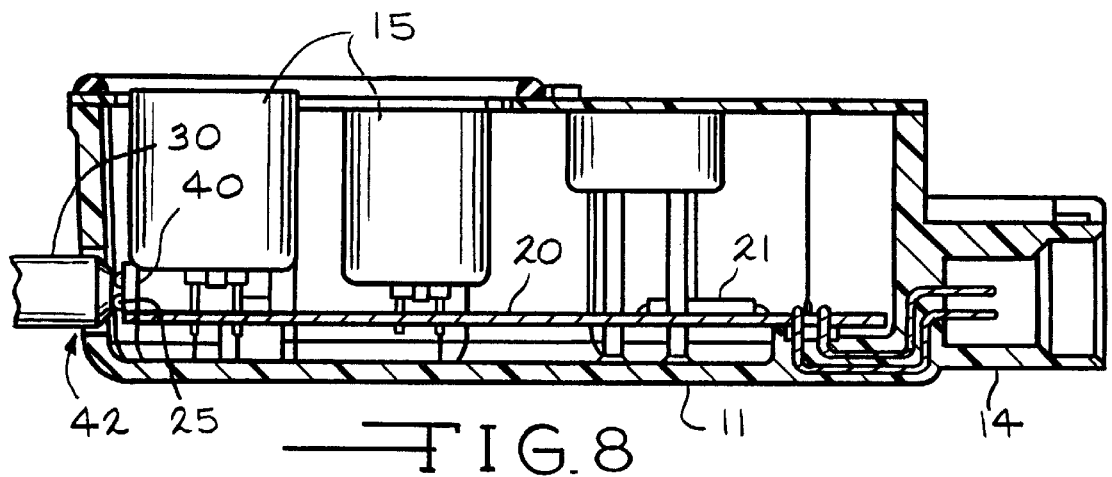
FIG. 8 is another alternate embodiment of the control module shown in FIG. 4.

Another alternate embodiment of the invention is illustrated in FIG. 8, where components similar to components shown in the preceding figures have the same numerical designators. In the alternate embodiment shown in FIG. 8, the surface contacts 25 are formed upon an extension 40 of the PCB 20 which extends in an upward direction in FIG. 8. The PCB extension 40 is adjacent to a side of the ECM housing 11. An aperture 42 is formed though the side of the housing 11 to allow the programming tool 30 access to the surface contacts 25. Accordingly, the alternate embodiment shown in FIG. 8 can be programmed or reprogrammed after being assembled to the associated valve body. As described above, a plug (not shown) is inserted into the aperture 42 after the microprocessor 21 is programmed.

Figure 9:
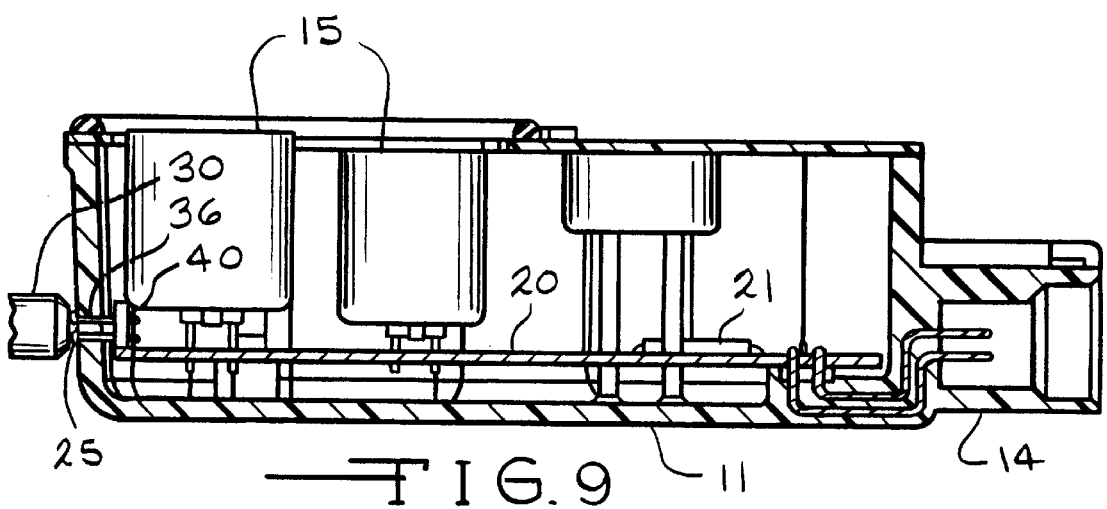
FIG. 9 is an alternate embodiment of the control module shown in FIG. 8.

An alternate embodiment of the ECU shown in FIG. 8 is illustrated in FIG. 9. In FIG. 9, the microprocessor JTAG ports are electrically connected to pins 36 which extend to the left in FIG. 9 through the left side of the housing 14. The pins 36 terminate in surface contacts 25 which are formed upon the exterior surface of the housing 25. Accordingly, the surface contacts 25 are directly accessible to the programming tool 30. Additionally, a plug is not required to seal the programming tool access aperture.

Figure 10:
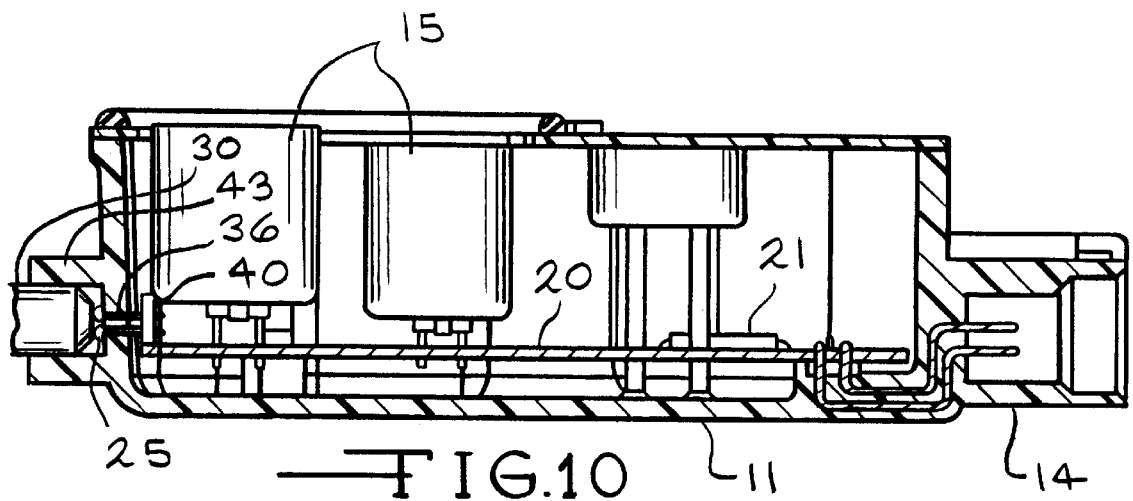
FIG. 10 is another alternate embodiment of the control module shown in FIG. 9.

FIG. 10 illustrates an alternate embodiment of the ECU shown in FIG. 9. In FIG. 10, a collar 43 is formed upon the housing 14 which extends perpendicularly therefrom. The collar 43 is formed around the surface contacts 25 and guides the programming tool 30 into contact with the surface contacts 25 for programming the microprocessor 21.

Figure 11:
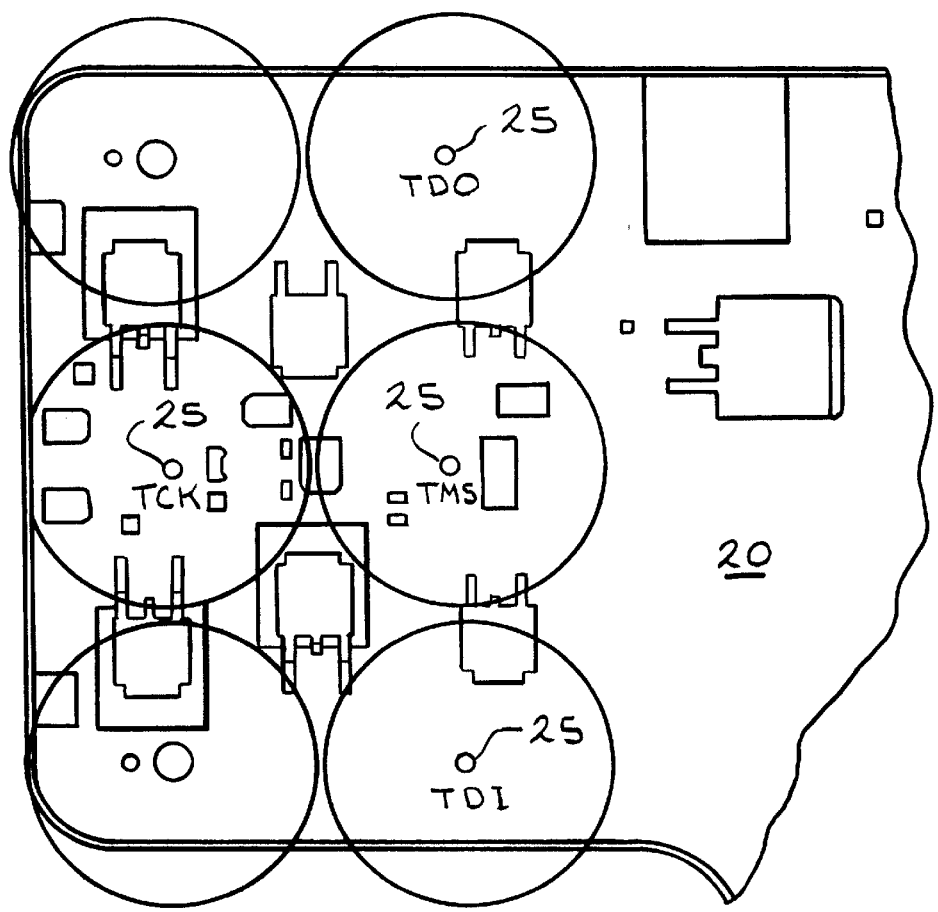
FIG. 11 is a plan view of an alternate embodiment of the circuit board shown in FIG. 3.

It will be appreciated that while the invention has been illustrated and described as utilizing six surface contacts 25, more or less surface contacts 25 may be used to program the microprocessor. For example, an alternate embodiment of the circuit board 20 is illustrated in FIG. 11. Components shown in FIG. 11 which are similar to components shown in FIG. 3 have the same numerical designators. The alternate embodiment circuit board 20 has four surface contacts 25 formed thereon. The contacts 25 are labeled in FIG. 11 for the following JTAG functions:

TCK—Test Clock;
TDO—Test Data Output;
TDI—Test Data Input; and
TMS—Test Mode Selector.

Each of the surface contacts 25 is aligned with a bore 45 which passes through one of the solenoid coils 15. The bores 45 normally receive a sleeve (not shown) which extends from the valve body. The sleeves enclose the armature for the solenoid valves.

Figure 12:
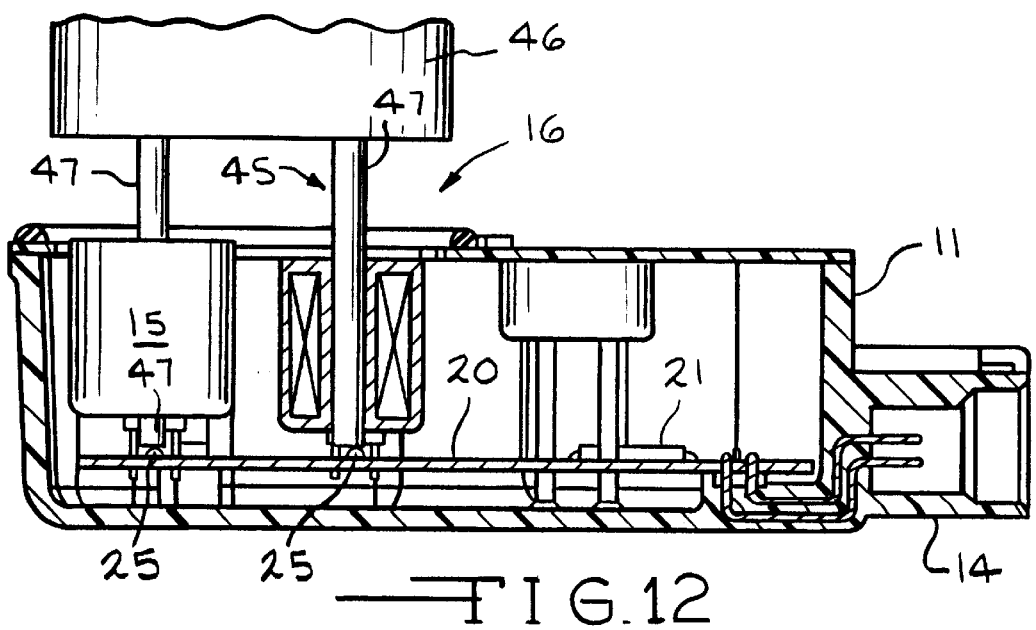
FIG. 12 is sectional view taken along line 2-2 of the control module in FIG. 1 which illustrates remote programming of a module which includes the circuit board shown in FIG. 12.

An alternate embodiment of a programming tool 45 is illustrated in FIG. 12. The tool 45 includes a body 46 having a plurality of probes 47 extending therefrom. A conductor (not shown) extends axially through each of the probes 47. As illustrated in FIG. 12, each of the probes extends through a corresponding coil bore 45 and contacts one of the surface contacts 25. The conductor is thus brought into contact with the surface contacts 25 and the microprocessor ROM can be flash programmed as described above.

Figure 13:
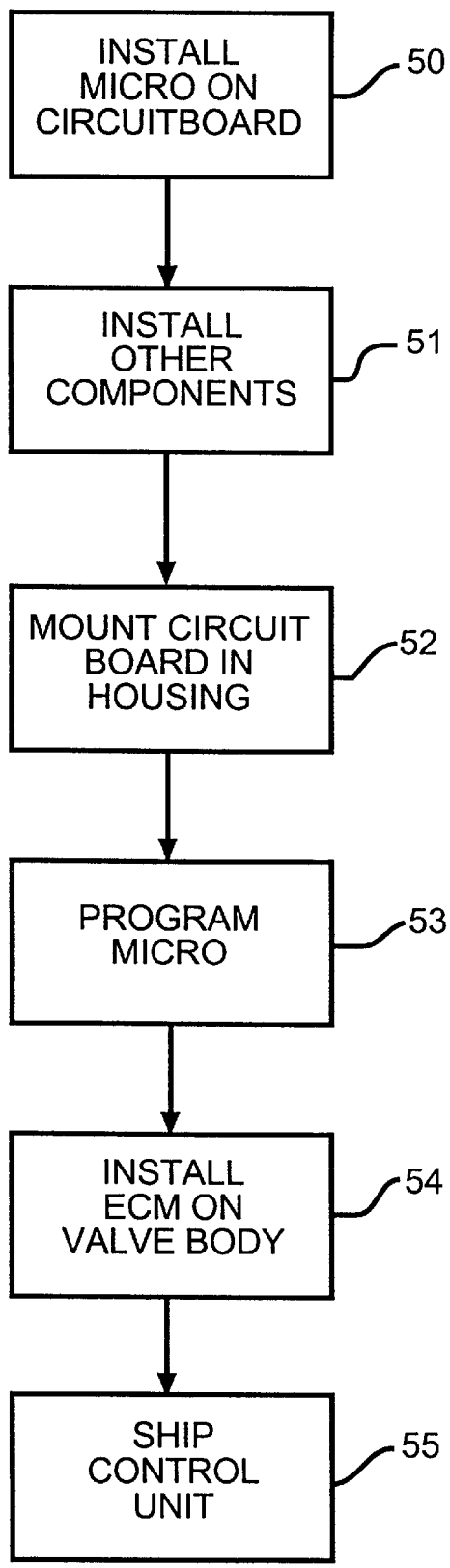
FIG. 13 is a flow chart of a method for assembling the control module shown in FIG. 1 which includes remote programming.

The present invention also contemplates a method for remote programming of the microprocessor 21. The method is illustrated in FIG. 13 for the EHCU 10 shown in FIG. 4. In functional block 50, an unprogrammed microprocessor is installed upon a circuit board or substrate. The other electrical components, including the solenoid coils, are installed upon the circuit board or substrate in functional block 51. The circuit board or substrate is mounted within the ECM housing in functional block 52 and the electrical connectors coupled thereto.

In functional block 53, the microprocessor is programmed. The programming tool is extended into the ECM housing through the opening for the solenoid sleeves and into contact with the surface contacts. The Microprocessor ROM is then flash programmed. Upon completion of the programming, the programming tool is withdrawn from the housing. The programmed ECM is then installed upon the associated valve body in functional block 54 and the assembled and programmed EHCU is shipped to the vehicle manufacturer in functional block 55.

It will be appreciated that, for the ECU's shown in FIGS. 5 through 10, the steps shown in functional blocks 53 and 54 may be interchanged. Because the surface contacts are formed on the exterior surface of the housing, the microprocessor can alternately be programmed after the ECU is installed upon the valve body.

Figure 14:
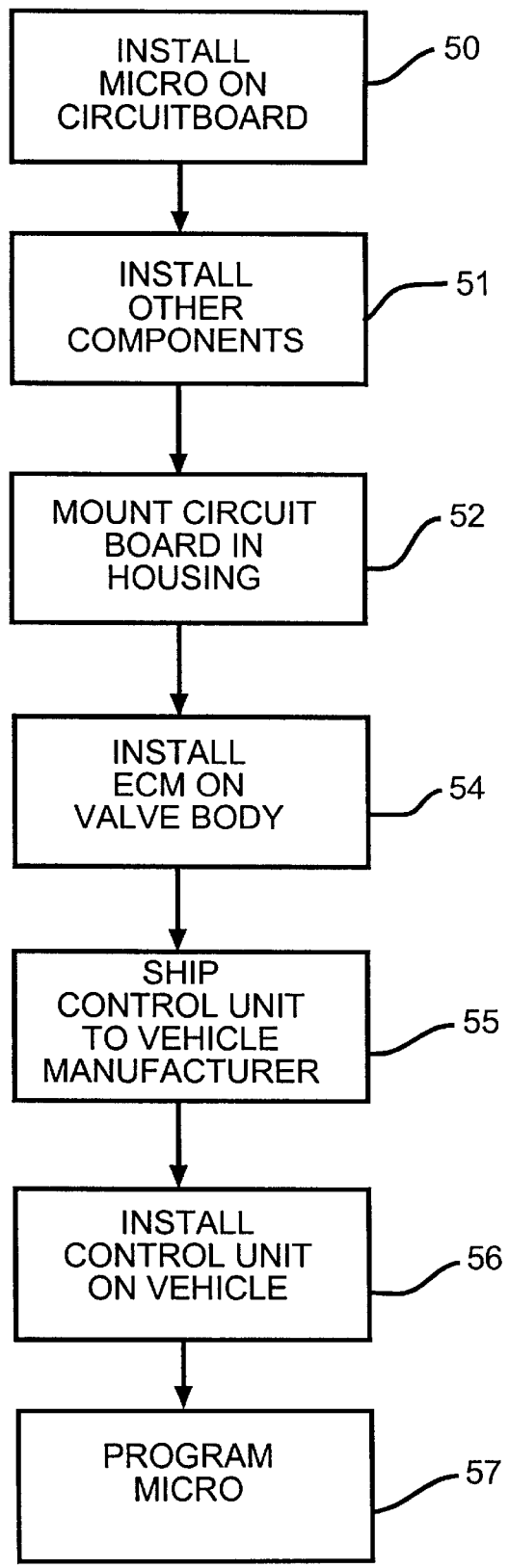
FIG. 14 is a flow chart of an alternate method for assembling the control modules shown in FIGS. 5 through 10 which includes remote programming.

An alternate embodiment of the manufacturing process is illustrated in FIG. 14 where functional blocks which are similar to functional blocks shown in FIG. 13 have the same numerical identifiers. The process shown in FIG. 14 can be utilized with the ECM's shown in FIGS. 5 through 10. In the process, the EHCU is completely assembled in functional blocks 50 through 54, but not programmed. The assembled EHCU is shipped to the vehicle manufacturer in functional block 55 and installed on a vehicle in functional block 56. The microprocessor is then programmed in functional block 57 with the algorithm corresponding to the particular vehicle in which the EHCU is installed. It will be appreciated that the final two steps may be interchanged, with the microprocessor being programmed by the vehicle manufacturer before installation of the EHCU upon the vehicle.

Figure 15:
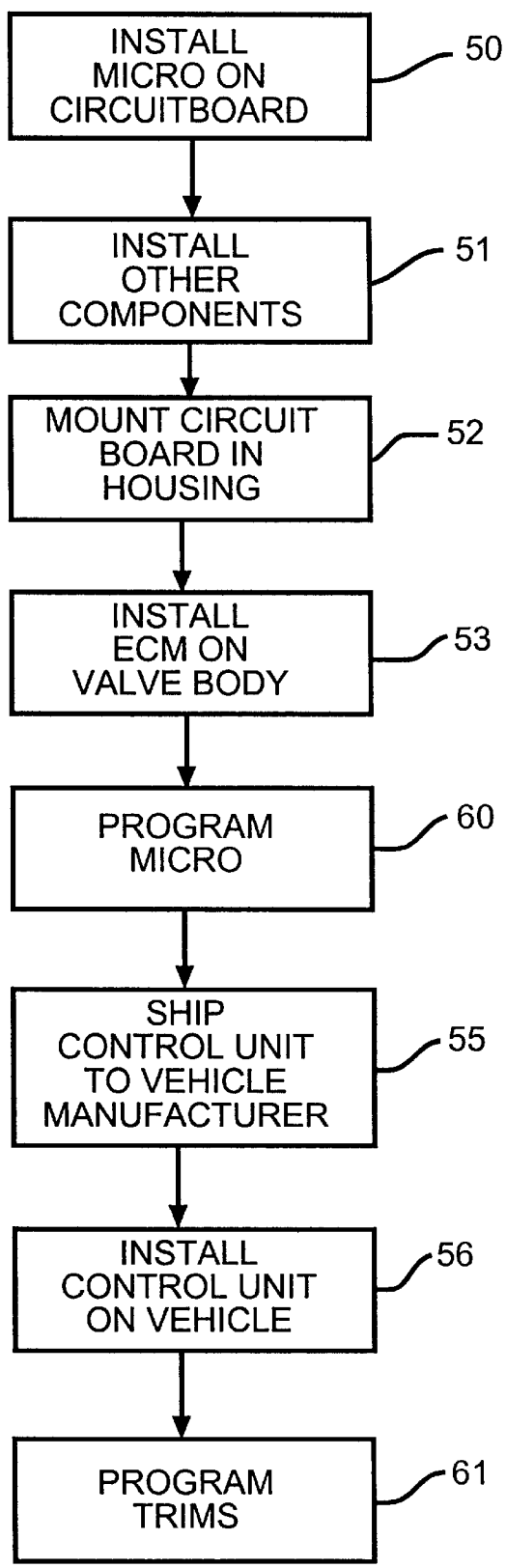
FIG. 15 is an alternate embodiment of the flow chart shown in FIG. 14.

Another alternate embodiment of the manufacturing process is illustrated in FIG. 15 where functional blocks which are similar to functional blocks shown in FIGS. 13 and 14 have the same numerical identifiers. The process shown in FIG. 15 is similar to the-process shown in FIG. 14 except that a basic ABS control algorithm is installed in the microprocessor in functional block 60 before the EHCU is shipped to the vehicle manufacturer. The vehicle manufacturer then installs the trims for the particular version of the vehicle after the EHCU is installed upon the vehicle, as shown in functional block 61. Alternately, the manufacturer can install the trims before installing the EFWU upon the vehicle. The process shown in FIG. 15 accommodates variations in the manufacturer's build requirements.

Figure 16:
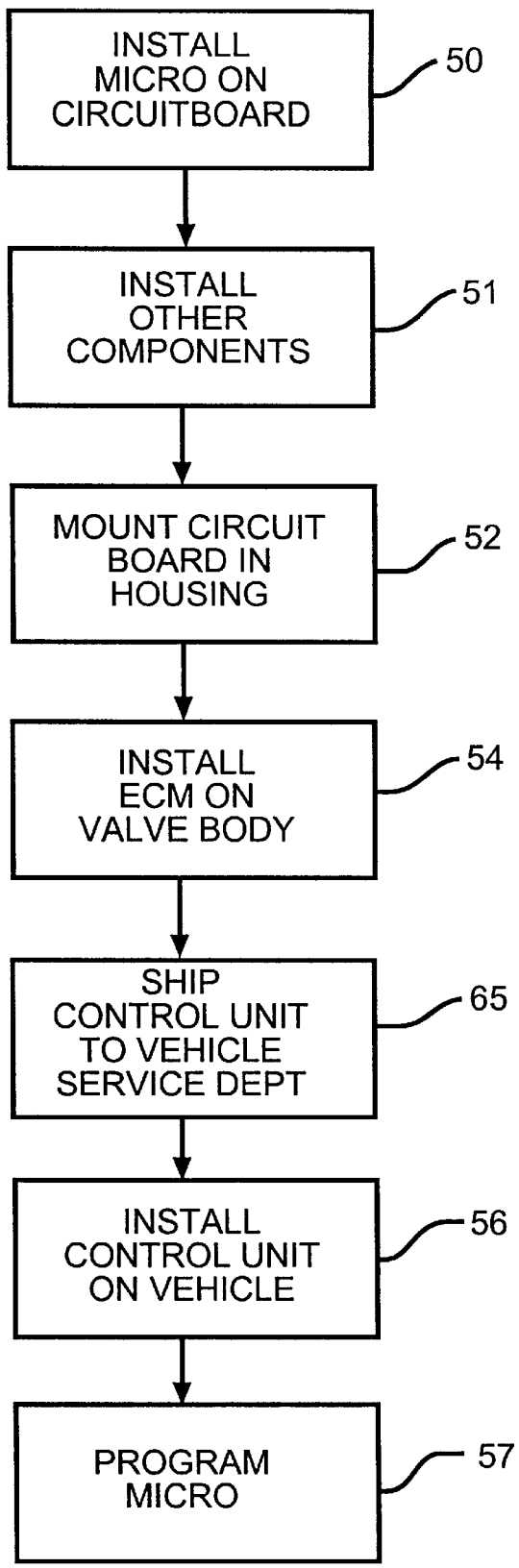
FIG. 16 is another alternate embodiment of the flow chart shown in FIG. 14.

Another alternate embodiment of the manufacturing process is illustrated in FIG. 16 where functional blocks which are similar to functional blocks shown in FIG. 14 have the same numerical identifiers. Similar to the process shown in FIG. 14, the EHCU is completely assembled in functional blocks 50 through 54, but not programmed. The assembled EHCU is shipped to a service department for the vehicle in functional block 65 as a replacement part. When needed, the assembled EHCU is installed on a vehicle in functional block 56. The microprocessor is then programmed in functional block 57 with the algorithm corresponding to the particular vehicle in which the EHCU is installed. It will be appreciated that the final two steps may be interchanged, with the microprocessor being programmed by the service department before installation of the EHCU upon the vehicle. The process shown in FIG. 16 reduces the inventory of spare EHCU's which must be maintained at the service department.

Additionally, it is contemplated that the manufacturer may only load a boot program into the microprocessor. The control algorithm and trim values are then loaded later at the same or different facilities.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope. For example, while the preferred embodiment of the invention has been illustrated and described in terms of an electronic control module for an ABS, it will be appreciated that the invention also can be practiced with other control systems, such as, for example, Traction Control (TC) and Vehicle Stability Control (VSC).

What is claimed is:

1. An electronic control unit for an anti-lock brake system comprising:
    a housing having an aperture formed therethrough;
    a circuit substrate disposed within said housing;
    a microprocessor mounted upon said substrate for controlling the anti-lock brake system; and
    at least one electrical contact surface mounted upon said substrate; said surface contact adjacent to said housing aperture and electrically connected to said microprocessor, such that said contact provides a temporary electrical connection to a tool for transferring an algorithm for operating the anti-lock brake system through said contact to said microprocessor.

2. A control module according to claim 1 wherein said microprocessor includes a memory and said algorithm is stored within said memory.

3. A control module according to claim 2 wherein said memory is a read only memory.

4. A control module according to claim 2 wherein a plurality of electrical contacts are mounted upon said substrate, said contacts being electrically connected to said microprocessor and being adapted to be connected to said tool for transferring said algorithm.

5. A control module according to claim 4 wherein said tool has a single probe portion which extends into said housing, said probe carrying a plurality of conductors, each of said conductors contacting a corresponding surface contact for transferring said algorithm.

6. A control module according to claim 4 wherein said tool has a plurality of probes which extend into said housing, each of said probes carrying at least one conductor, each of said conductors contacting a corresponding surface contact for transferring said algorithm.

7. An electronic control unit for an anti-lock brake system comprising: a housing;
    a microprocessor disposed within said housing for controlling the anti-lock brake system; and
    at least one electrical contact surface mounted upon an exterior surface of said housing; said contact extending through said housing and being electrically connected to said microprocessor, said contact providing a temporary electrical connection to a tool for transferring an algorithm for operating the anti-lock brake system through said contact to said microprocessor.

8. A control module according to claim 7 wherein said microprocessor includes a memory and said algorithm is stored within said memory.

9. A control module according to claim 8 wherein said memory is a read only memory.

10. A control module according to claim 7 wherein a plurality of electrical contacts are mounted upon said housing external surface, said contacts being electrically connected to said microprocessor and being adapted to be connected to said tool for transferring said algorithm.

11. A control module according to claim 10 wherein said tool has a single probe portion which extends onto said housing, said probe carrying a plurality of conductors, each of said conductors contacting a corresponding surface contact for transferring said algorithm.

12. A control module according to claim 11 further including a collar formed upon said housing exterior surface, said collar extending around said surface contacts and cooperating with said tool probe to guide said probe conductors into contact with said surface contacts.

13. A process for assembling a electro-hydraulic control unit for an anti-lock brake system comprising the steps of:
   (a) providing a microprocessor;
   (b) installing the microprocessor upon a circuit substrate;
   (c) installing the circuit substrate in an electronic control module housing, the microprocessor being electrically connected to at least one surface mounted electrical contact;
   (d) extending a programming tool into contact with the surface contact;
   (e) loading an algorithm into the microprocessor;
   (f) retracting the programming tool; and
   (g) assembling the electronic control module upon a control valve body to form an electro-hydraulic electronic control unit.

14. A process according to claim 13 wherein the surface contact is formed upon the circuit substrate and, in step (d), the programming tool is extended into the housing to contact the surface contact.

15. A process according to claim 14 wherein said microprocessor includes a memory and in step (e) the algorithm is loaded into the memory.

16. A process according to claim 15 wherein a plurality of surface contacts are formed upon the circuit substrate.

17. A process according to claim 16 wherein the programming tool includes a probe which carries a plurality of conductors, and further wherein in step (e) each of the conductors electrically contacts a corresponding surface contact.

18. A process according to claim 15 wherein a plurality of solenoid coils are mounted upon the substrate, each of the coils having an axial bore formed therethrough, and further wherein the surface contacts are formed at the base of the coils and the programming tool includes a plurality of probes, each of the probes extending trough a corresponding coil bore to electrically contact a surface contact.

19. A process according to claim 13 wherein the surface contact is formed upon the exterior of the housing and extends therethrough, the surface contact being electrically connected to the microprocessor and further wherein, in step (d), the programming tool is extended onto the housing to contact the surface contact.

20. A process according to claim 19, further including a collar formed upon the housing external surface, the collar extending around the surface contact and cooperating with the programming tool to guide the probe into contact with the surface contact.

21. A process for assembling an electro-hydraulic control unit for an anti-lock brake system comprising the steps of:
   (a) providing a microprocessor;
   (b) installing the microprocessor upon a circuit substrate;
   (c) installing the circuit substrate in an electronic control module housing, the microprocessor being electrically connected to at least one surface mounted electrical contact;
   (d) assembling the electronic control module upon a control valve body to form an electro-hydraulic control unit;
   (e) shipping the assembled electro-hydraulic control unit to a vehicle manufacturer;
   (f) extending a programming tool into contact with the surface contact;
   (g) programming the microprocessor; and
   (h) retracting the programming tool.

22. A process according to claim 21 wherein the surface contact is formed upon the circuit substrate and the housing has an aperture formed therethrough which is adjacent to the surface contact and further wherein, in step (f), the programming tool is extended through the housing aperture to contact the surface contact.

23. A process according to claim 21 wherein the surface contact is formed upon the exterior of the housing and extends therethrough, the surface contact being electrically connected to the microprocessor and further wherein, in step (f), the programming tool is extended onto the housing to contact the surface contact.

24. A process for assembling an electro-hydraulic control unit for an anti-lock brake system comprising the steps of:
   (a) providing a microprocessor;
   (b) installing the microprocessor upon a circuit substrate;
   (c) installing the circuit substrate in an electronic control module housing;
   (d) assembling the electronic control module upon a control valve body to form an electro-hydraulic control unit, the microprocessor being electrically connected to at least one surface mounted electrical contact;
   (e) extending a programming tool into contact with the surface contact;
   (f) programming the microprocessor with a basic anti-lock brake system control algorithm;
   (g) retracting the programming tool;
   (h) shipping the assembled electronic control unit to a vehicle manufacturer;
   (i) extending a programming tool into contact with the surface contact;
   (j) programming the microprocessor with trims corresponding to a specific vehicle being assembled by the vehicle manufacturer; and
   (k) retracting the programming tool.

25. A process according to claim 24 wherein the surface contact is formed upon the circuit substrate and the housing has an aperture formed therethrough which is adjacent to the surface contact and further wherein, in steps (e) and (i), the programming tool is extended through the housing aperture to contact the surface contact.

26. A process according to claim 24 wherein the surface contact is formed upon the exterior of the housing and extends therethrough, the surface contact being electrically connected to the microprocessor and further wherein, in steps (e) and (i), the programming tool is extended onto the housing to contact the surface contact.

* * * * *